United States Patent [19]

Regan

[11] 4,336,513
[45] Jun. 22, 1982

[54] HUM REDUCTION CIRCUIT
[75] Inventor: Richard J. Regan, Beverly, Mass.
[73] Assignee: Hewlett-Packard Company, Palo Alto, Calif.
[21] Appl. No.: 165,171
[22] Filed: Jul. 2, 1980
[51] Int. Cl.³ .................. H03H 19/00; H03H 17/00; H03H 17/02
[52] U.S. Cl. ................................. 333/173; 333/19; 333/167
[58] Field of Search .................. 333/167, 173, 19; 328/151, 165, 167

[56] References Cited
U.S. PATENT DOCUMENTS
3,729,695  4/1973  Condon ............................. 333/173
3,793,599  2/1974  Coor ................................. 328/165 X
3,795,877  3/1974  Poole ................................. 333/173

Primary Examiner—Marvin L. Nussbaum
Attorney, Agent, or Firm—Donald N. Timbie

[57] ABSTRACT

Apparatus for reducing the fundamental and harmonic frequencies of hum in a signal comprising means for placing a plurality of signal storage means between an input to which the signal is applied and an output in repeated sequence that is synchronous with the fundamental frequency of hum in such manner as to subtract the amount of signal stored from the signal passing between the input and output. The storage means are in a charging circuit having a time constant such that it requires a number of sequences to build the signal stored to its full amplitude.

13 Claims, 4 Drawing Figures

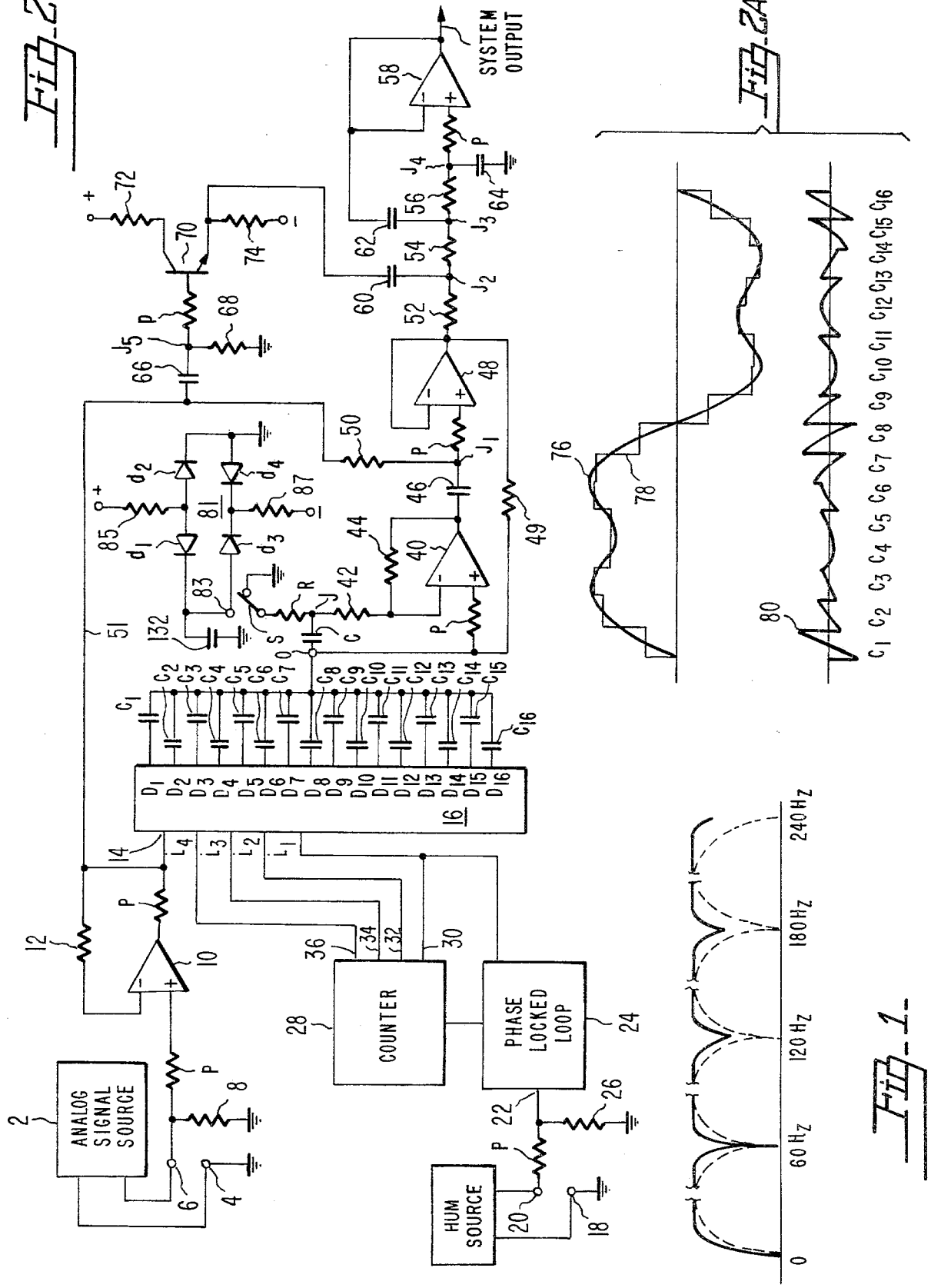

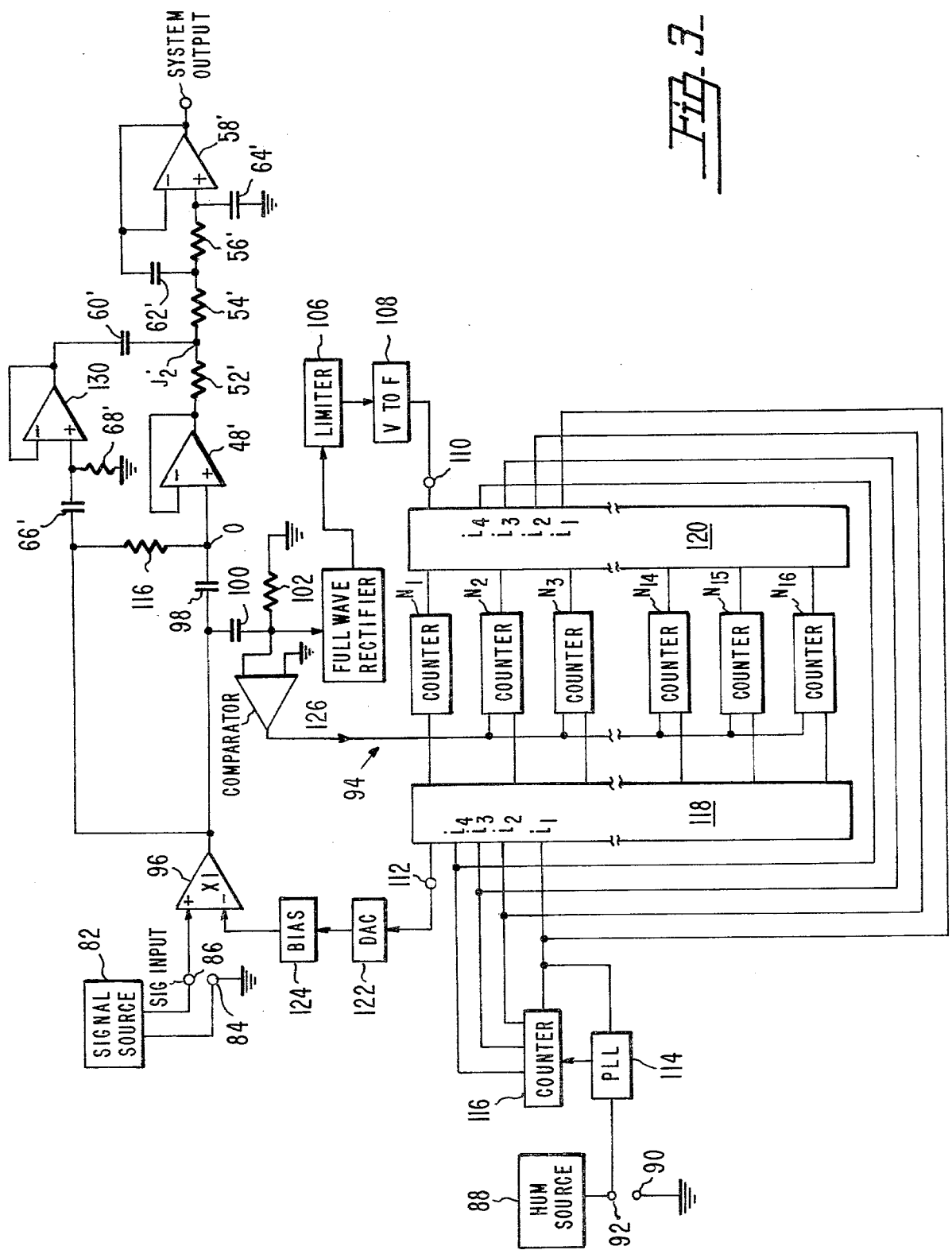

HUM REDUCTION CIRCUIT

BACKGROUND OF THE INVENTION

One of the ever-present problems of sensitive electronic instruments such as ECG machines that are used to provide signals indicative of the electrical activity of the heart is the presence of hum in the output signal. Whereas an instrument can often be designed so as to be fairly free from hum if it is operating in a relatively weak field environment, this is not always the case, the other equipment is usually present. Generally, the hum is an AC wave of the power line frequency, but it can have many harmonics picked up from nearby equipment such as those produced by the full wave rectifier of X-ray machines. In fact, the harmonics may have greater amplitude than the power line frequency.

One way of reducing hum is to pass the signal through an electronic notch filter having tuned circuits that provide maximum attenuation for a single predetermined frequency. If the hum contains the power line frequency as well as harmonics thereof, a number of notch filters must be used, one for each frequency to be attenuated. With most designs, the Q of these filters is not nearly as high as desired so that signal frequencies that lie considerably above and below that to which the filter is tuned are also attenuated. Furthermore, if high Q's are attained, variation in the values of the circuit components of the filter as well as variations in the power line frequency can cause the maximum attenuation of the filter to occur at a frequency different from that of the hum.

BRIEF DESCRIPTION OF THE INVENTION

In accordance with this invention, signal storage devices are commutated one after the other in a repeated sequence that is in synchronism with the lowest hum frequency to be attenuated into a circuit connected between an input to which a signal having hum is applied and an output at which a hum-free signal is to appear. The circuit is such as to increase the value of the signal stored on a device when the device is connected in the circuit by a portion of the difference between the signal applied to the input and the value previously stored and as to subtract the value stored on each device from signals passing between the input and the output. The hum is assumed to have constant amplitude, frequency and phase. Because of the cyclic commutation in synchronism with the hum contained in the signal, the same portions of each cycle of hum are respectively applied to the storage devices so as to build up the values stored thereon during successive commutation cycles to the corresponding values of the hum. Subtraction of these values from the signal applied to the input removes the hum from the signal before it arrives at the output. Although the desired signal may have a component having the same frequency as the hum and/or its harmonics, the values stored on the storage devices does not build up to the amplitude of the signal component because it is generally not synchronous with the cyclic commutation.

In one embodiment of the invention employing analog circuits, the signal containing the hum to be rejected is applied to a first input and a signal corresponding to the lowest frequency component of the hum is applied to a second input. Equal valued capacitors serve as the storage devices and commutating means are provided for connecting the capacitors one after the other between the first input and the output in synchronism with the hum applied to the second input. A resistor is connected across the output so as to provide for each capacitor as it is commutated into the circuit a charge path having a time constant that is long with respect to the time that a capacitor is connected to it. Thus, each time a capacitor is connected in the circuit, it is charged to a voltage that is a portion of the difference between the value of the signal applied to the first input and the voltage to which the capacitor was previously charged. After a number of commutation cycles, depending on the time constant referred to, the voltage across each capacitor equals the average value of the hum occurring when it is connected in the circuit. These average values are subtracted from signals passing from the first input to the output. Any differences between the voltages stored on the capacitors and the hum occur at the rate of commutation which is selected to be well above the highest signal frequency of interest so that they can be removed by a low pass filter.

In an embodiment of the invention employing digital circuits, the signal is applied to a first input and the hum is applied to a second input as in the analog system. The first input is connected to the non-inverting input of a differential amplifier and its output is connected to a full wave rectifier. An amplitude limiter is connected between the output of the rectifier and a voltage-to-frequency converter, and its output is connected to a first terminal. A second terminal is connected to a digital-to-analog converter, and its output is connected to the inverting input of the differential amplifier via a bias circuit. Up-down counters serve as the storage devices and are commutated between said first and second terminals in synchronism with hum applied to the second input. A comparator is connected between the output of the differential amplifier and each of the counters, at least when they are connected between the first and second terminals, so as to determine whether they count up or down.

In the analog embodiment of the invention, circuit means are provided for reducing the effect of any inequality in the values of the storage capacitors. In both the analog and digital embodiments, the signal at the first input may be bypassed to the output by an integrating circuit in accordance with another aspect of this invention so that low signal frequencies, including DC, are not attenuated. In accordance with a further aspect of the invention, the second derivative of the signal applied to the first input is added to the signal appearing at the output so as to attenuate the higher hum frequencies to the same extent as the fundamental hum frequency.

THE DRAWINGS

FIG. 1 is a graphical illustration of the attenuation characteristics of the notch filters of the prior art and the characteristics of the hum-bucking circuit of this invention;

FIG. 2 is a schematic illustration of an analog embodiment of this invention;

FIG. 2A is a graphical illustration of hum and the voltages across the capacitors that serve as storage devices in FIG. 1; and FIG. 3 is a schematic illustration of a digital embodiment of this invention.

In FIG. 1, the dotted line indicates the notches that can be made by a plurality of standard filters. The width of each notch is what can be expected with a Q of 10 that can be attained by conventional means. On the other hand, the solid line indicates notches made by a single filter constructed in accordance with a basic circuit of this invention so as to have a Q of at least 100. It is also seen that the maximum attenuation decreases with each harmonic. This can be rectified by utilizing an addition to the basic circuit that adds the second derivative of the signal to the signal. The attenuation of frequencies close to zero can be alleviated by using a bypass circuit in addition to the basic circuit.

In the analog circuit of FIG. 2, a source 2 of analog signals is coupled to a first input comprised of a grounded terminal 4 and an ungrounded terminal 6. The latter is connected to ground by a coupling resistor 8 and is connected to the non-inverting input of an amplifier 10 via a protection resistor p. All other protection resistors are similarly designated. The output of the amplifier 10 is connected by resistors p and 12 to its inverting input and by the resistor p to a signal input 14 of a switch 16, which may be type CD4067B. The switch 16 connects the input 14 to outputs $D_1$–$D_{16}$ in repeated sequence at a frequency determined by the frequencies of square waves provided at inputs $i_1$, $i_2$, $i_3$ and $i_4$ respectively.

The lowest frequency to be attenuated, which is assumed to be that of a power line of 50 Hz or 60 Hz, is applied to a second input having a grounded terminal 18 and an ungrounded terminal 20. The latter is coupled via resistor p to an input 22 of a phase-locked loop 24, which may be type CD4046B, and a coupling resistor 26 is connected between the input 22 and ground. Although not shown, the various terminals of the phase-locked loop 24 are interconnected by appropriate resistors and capacitors as required. The square wave output of the phase-locked loop 24 is applied to a binary counter 28, such as type CD4024B, that outputs square waves of 60 Hz, 120 Hz, 240 Hz and 480 Hz on leads 30, 32, 34 and 36 respectively. The lead 30 is connected to an appropriate input of the phase-locked loop 24 so that all of the square waves are synchronized with the sixty-cycle sine waves applied to the second input 18, 20. Connections are made between the leads 30, 32, 34 and 36 and the inputs $i_1$, $i_2$, $i_3$ and $i_4$ respectively. Storage capacitors $C_1$–$C_{16}$ of equal large values are respectively connected between the outputs $D_1$–$D_{16}$ of the switch 16 and an output terminal O. In this particular embodiment, compensation for noise that may be caused by certain variations in the value of the storage capacitors $C_1$–$C_{16}$ is made by connection of a capacitor c having a capacitance that is small with respect to that of any one of the capacitors $C_1$–$C_{16}$ in series with a resistor R between the output O and ground via a switch S. If such low frequency compensation is not desired, the capacitor c can be replaced by a shunt circuit.

The circuits between the first input 4, 6 and the output O are circuit means to which a storage means, any one of $C_1$–$C_{16}$, may be connected for subtracting a value stored by the storage means during the time it is connected from the signals passing from the first input 4, 6 to the output O, and for changing the value stored in said storage means by a fraction of the difference between a signal applied to said first input 4, 6 and a value stored on said storage means.

The phase-locked loop 24, the counter 28 and the switch 16 together constitute a commutating means for connecting said storage means, one after the other, into the circuit means just set forth in a repeated sequence having the frequency of the fundamental of hum, herein assumed to be 60 Hz, so that the values stored, voltages on $C_1$–$C_{16}$, eventually become equal to the average value of the hum in the signal applied to the first input 4, 6 occurring at the time a capacitor $C_1$–$C_{16}$ is connected into the circuit means.

The output O is connected to the non-inverting input of an amplifier 40 via a protection resistor p, and the junction J of the capacitor c and the resistor R is connected via a resistor 42 to the inverting input. The output of the amplifier 40 is connected via a resistor 44 to its inverting input. A capacitor 46 and a resistor p are connected in series between the output of the amplifier 40 and the non-inverting input of a buffer amplifier 48, the output of which is directly connected to its inverting input.

A bypass circuit for low signal frequencies appearing at the input 4, 6 is comprised of a resistor 50 connected via a lead 51 between the input 14 of the switch 16 and the junction $J_1$ of the capacitor 46 and the resistor p. The resistor 50 and the capacitor 46 comprise a low pass filter so as to augment the low frequencies appearing at the output of the amplifier 40 that are attenuated for reasons that will be set forth.

The output of the buffer amplifier 48 is coupled via a large resistor 49 to the non-inverting input of the amplifier 40 for biasing purposes, and a low pass filter is coupled between the output of the buffer amplifier 48 and the final output of the circuit for eliminating the high frequency components caused by the fact that the voltages on each of the capacitors $C_1$–$C_{16}$ is the average of the hum in the signal occurring during the time the capacitor is in the circuit rather than the true value of the hum. The low pass filter in comprised of resistors 52, 54, 56 and p connected in series to the non-inverting input of an amplifier 58, a capacitor 60 connected between the junction $J_2$ of resistors 52 and 54 and a point of low impedance which may be ground, a capacitor 62 connected between the junction $J_3$ of the resistors 54 and 56 and the output of the amplifier 58, a capacitor 64 connected between the junction $J_4$ of the resistors 56 and p and ground, and a direct connection between the output of the amplifier 58 and its non-inverting input. The output of the amplifier 58 is the output of the invented hum-bucking system at which hum is substantially reduced.

It will be apparent to those skilled in the art that the connection to the switch 16 and capacitors $C_1$–$C_{16}$ could be reversed, i.e., instead of connecting one side of all capacitors $C_1$–$C_{16}$ to the output O and the input of the switch 16 to the output of the amplifier 10, as shown, the one side of the capacitors $C_1$–$C_{16}$ could be connected to the output of the amplifier 10 and the input 14 could be connected to the output O.

Whereas sixteen storage capacitors $C_1$–$C_{16}$ provide good performance when the ECG signals are involved, it has been found preferable to use more storage capacitors, e.g., thirty-two, when the signal is derived from a bundle of HIS, which has higher frequency components, in order that the frequency of the differences between the voltage of the hum and the stored voltages such as illustrated in the wave 80 of FIG. 2A can be raised above the highest frequency of interest and removed by a low pass filter.

As used herein, the term "fundamental frequency of hum" refers to the lowest frequency of hum that is to be attenuated.

Although it is generally more convenient to use the power line as the source of hum to be applied to the input 18, 20, any source of the same frequency can be used regardless of its phase.

In order to increase the attenuation for the high hum frequencies, a means is provided for deriving an approximation of the second derivative of the signal and combining it with the output signal. A capacitor 66 and a resistor 68 connected in series between the signal input 14 of the switch 16 and ground provide the first derivative of the signal at their junction $J_5$ that is connected via a resistor p to the base of an NPN transistor 70. The collector is connected via a resistor 72 to a point of positive operating potential and the emitter is connected to a point of negative operating potential via a resistor 74. The second derivative is derived by the capacitor 60 and the resistor 52 so as to be added to the signal in the low pass filter including the resistors 52 and the capacitor 60. If the second derivative circuit is not used, the capacitor 60 can be connected to ground.

Reference is now made to a diode bridge circuit 81 that operates in a manner to be described to vary the Q of the circuit as a function of signal amplitude so as to minimize ringing in response to very large pulses while providing a reasonably rapid response to normal hum levels. The bridge is brought into operation by connecting the switch s to a terminal 83 instead of to ground, and is comprised of diodes $d_1$ and $d_2$ connected in series with opposite polarities, the cathode of $d_1$ being connected to the terminal 83 and the cathode of $d_2$ being connected to ground. Diodes $d_3$ and $d_4$ are connected in series with opposite polarities, the anode of $d_3$ being connected to the terminal 83 and the anode of $d_4$ being connected to ground. A resistor 85 is connected between the anodes of $d_1$ and $d_2$ and a point of positive potential, and a resistor 87 is connected between the cathodes of $d_3$ and $d_4$ and a point of negative potential.

OPERATION OF FIG. 2

Assume that the hum is a voltage indicated by the smooth line 76 of FIG. 2A and has a fundamental frequency of 50 Hz or 60 Hz that happens to be in phase with the cyclic commutation of the capacitors $C_1$-$C_{16}$ into the circuit. The times at which the capacitors are connected in the circuit are indicated by $C_1$-$C_{16}$ respectively. During each cycle of the hum 76, the capacitors $C_1$-$C_{16}$ will be charged to a portion of the difference between the charge voltage built up during previous cycles and the hum voltage present at the input 4, 6. If the small capacitor c were shorted out, the portion would depend on the time constant of the capacitors C and the resistor R. After a number of cycles, the capacitors $C_1$-$C_{16}$ would be charged up to voltages indicated by the stepped wave 78, which is near the average voltage of the hum occurring when a capacitor is connected into the circuit. Because of the polarity of these voltages across the respective capacitors $C_1$-$C_{16}$ is such as to oppose the hum voltage 76 contained in the signal at the first input 4, 6, the portion of the hum voltage appearing at the output O is the hum voltage 76 minus the capacitor voltages 78 so as to yield a voltage indicated by the wave 80. The frequency components of the wave 80 are related to the frequency $60 \times 16 = 960$ Hz and are removed by the low pass filter 52, 60; 54, 62; and 56, 64 without affecting a desired signal such as an ECG wave in which the highest frequency component of interest is less than 250 Hz. Because the signal components are not repetitive, even those at the commutation frequency, they build up little or no average charge on the capacitors $C_1$-$C_{16}$ so that they pass to the output O without significant attenuation.

In this particular example, the fundamental frequency component of the hum 76 was selected so as to be in phase with the commutation cycle but that is not important as any phase relationship, as long as it is constant, will do. The hum 76 is shown as having a third harmonic present, i.e., 180 Hz. Thus, the profile of charges across the capacitors $C_1$-$C_{16}$ includes a 60 Hz component of one cycle and a 180 Hz component of three cycles. The notches in the solid line wave of FIG. 1 become narrower as the RC time constant increases.

The capacitor c avoids the need for using expensive storage capacitors $C_1$-$C_{16}$ that are well matched, and prevents the diode bridge 81, when used, from becoming improperly biased when the signal includes low frequency components from zero to about 10 or 15 Hz. As signal components at such low frequencies change very little in amplitude during a number of commutation cycles, they will tend to build up small voltages across the storage capacitors $C_1$-$C_{16}$ that are subtracted from the signal. The resulting loss in amplitude can be compensated for by adding these low frequencies to the signal at the output of the amplifier 40 with the low pass filter comprised of the resistor 50 and the capacitor 46, but if the values of the capacitors $C_1$-$C_{16}$ are not all nearly the same, the voltages built up across them in response to such low frequency signals will respectively vary so as to change the voltage each subtracts from the signal during each commutation cycle. This produces ripples at frequencies above that at which commutation occurs. In the unusual circumstance that every other storage capacitor has a value greater than the average value and the other capacitors have values less than the average value, the ripple would have a maximum frequency equal to half the number of storage capacitors times the frequency of commutation and might be eliminated by the low pass filter 52, 60, 54, 62, 56, 60; but in most cases, this will not occur.

Less expensive unmatched storage capacitors $C_1$-$C_{16}$ can be used and the ripple referred to can be significantly reduced by making the capacitance of the capacitor c such that the impedance of the capacitor c is large for the low signal frequencies and quite small for the commutation frequency. In one embodiment, for example, the storage capacitors had a value of 1.0 uf, the capacitor c had a value of 0.39 uf, and the resistor R had a value of 10K ohms. Because of the small capacitance of the capacitor c with respect to the total capacitance of capacitors $C_1$-$C_{16}$, the low signal frequencies build up voltage across it rather than across the storage capacitors so that differences in their values has little effect because there is very little voltage across them to be subtracted from the signal voltage. Most of the low frequency signal voltage is across the capacitor c. In spite of the fact that the voltage that the hum produces across the capacitor c is also greater than it is across the storage capacitors $C_1$-$C_{16}$, the charge across them will eventually build up to the average value indicated by the stepped wave 78 of FIG. 2A.

The small attenuation in the higher frequencies of the desired signal caused by the presence of the capacitor c can be overcome by coupling the voltage at the junction J to the amplifier 40 so as to have a given negative gain and coupling the output O to the amplifier 40 so as to produce a gain that exceeds unity by the same amount as the negative gain and thus produce a net gain of unity. The value of the resistor 42 is very large, e.g., 1 megohm, and the value of the resistor 44 is very small, e.g., 10 thousand ohms, so that the gain of the amplifier 40 looking from the junction J is −0.01 and the gain looking from the output O is 1.01, thereby making the signal that appears at the output of the amplifier 40 have unity gain.

When no signal is present at the output O, all the diodes $d_1$, $d_2$, $d_3$ and $d_4$ of the bridge circuit 81 of FIG. 2 are conducting so that the terminal 83 is at virtual ground. When, however, the signal has a positive value beyond a small voltage of about +0.3 volts, the diode $d_3$ conducts and the resistance of the resistor 87 is added to that of the resistor R so as to increase the charge-discharge time constant for the storage capacitors $C_1$–$C_{16}$ when they are connected in the circuit. Similarly, when the signal has a negative value less than about −0.3 volts, the diode $d_1$ conducts so that the resistance of the resistor 85 is added to that of the resistor R. Inasmuch as the signal might have an offset of one polarity or the other of such magnitude as to unbalance the bridge 81 so that it increases the resistance of the charge circuit of the storage capacitors $C_1$–$C_{16}$ for signals of one polarity but not the other, some means must be provided for maintaining balance. The capacitor c performs this function.

The bias resistor 49 supplies bias current to the non-inverting input of the amplifier 40.

It will be noted from the solid curve of FIG. 1 that the frequencies at and just above zero are attenuated by the circuit thus far described. The signal is restored to its proper value by virtue of the fact that it is coupled via the lead 51 to the resistor 50, which in combination with the capacitor 46 forms a low pass filter. If restoration of low frequencies is not desired, the resistor 50 could be eliminated and the capacitor 46 replaced by a short circuit.

The second derivative circuit associated with the transistor 70 wherein the first derivative is derived by the capacitor 66 and the resistor 68 and the second derivative by the capacitor 60 and the resistor 52 serves to increase the attenuation for all harmonic hum frequencies.

The higher frequencies of the wave 80 of FIG. 2A that are left after the sequential subtraction from the signal of the voltages across the capacitors $C_1$–$C_{16}$ are eliminated from the output of the amplifier 58 by the low pass filter formed by the resistors 52, 54 and 56 and the capacitors 60, 62 and 64.

In the simplest form of the circuit, the capacitor c could be shorted out, the amplifier 40 could be a simple buffer, and the feed-forward lead 51 as well as the second derivative circuit associated with the transistor 70 could be omitted, but if the commutation noise 80 is to be eliminated, a low pass filter of some kind should be connected to the output of the amplifier 40.

COMPONENTS OF FIG. 2

Phase-Locked Loop 24—CD 4046 B
Counter 28—CD 4024 B
Switch 16—CD 4067 B
p—10K
r8—100K
r12—10K
r26—100K
R—10K
r42—1M
r44—10K
r49—1M
r50—10M
r52—100K
r54—100K
r56—100K
r68—20K
r72—1K
r74—10K
$C_1$–$C_{16}$—1.0 uf
c—0.39 uf
c46—0.39 uf
c60—0.0068 uf
c62—0.018 uf
c64—0.001 uf
c66—0.0082 uf Reference is now made to a digital embodiment of the invention shown in FIG. 3 wherein a first input to which the signal from a source 82 is applied is comprised of a grounded terminal 84 and an ungrounded terminal 86, and a second input to which the lowest frequency of the hum to be rejected is applied from a source 88 is comprised of a grounded terminal 90 and an ungrounded terminal 92.

Circuit means 94 to which a storage means may be connected for subtracting value stored by a storage means while it is connected in the circuit from signals passing from the first input 84, 86 to an output O and for changing the value stored in the storage means by a fraction of the difference between the signal applied to the first input 84, 86 and the values stored on the storage means may be described as follows. An operational amplifier 96 serves as a subtracting means, its non-inverting input being connected to the ungrounded input terminal 86 and its output being coupled via a capacitor 98 to the output terminal O. The output of the operational amplifier 96 is coupled via a capacitor 100 and a resistor 102 connected between the other side of the capacitor 100 and ground to the input of a full wave rectifier 104. The output of the full wave rectifier 105 is limited by a limiter 106 before being applied to a digital voltage to frequency converter 108. The count at the output of the voltage-to-frequency converter 108 is applied to a terminal 110. In this embodiment, the storage means are digital counters $N_1$–$N_{16}$ that are connected one after the other in a repeated sequence that is synchronous with the lowest frequency of hum to be attenuated between the terminal 110 and a terminal 112 that are included in the circuit means 94. This sequential connection of the counters $N_1$–$N_{16}$ is brought about by a phase-locked loop 114 that is synchronized by connection to the second or hum input 90, 92 and a counter 116 connected to the phase-locked loop 114 in the same manner as the counter 28 was coupled to the phase-locked loop 24 of FIG. 2. Two switching devices 118 and 120, each of which is identical to the switch 16 of FIG. 2, are coupled to the square wave output of the counter 116 and respectively operate to connect the terminals 110 and 112 to the inputs and outputs respectively of the counters $N_1$–$N_{16}$.

A digital-to-analog converter 122 is connected to the terminal 112 so as to convert the count in the counter $N_1$ that is shown connected between the terminals 110 and 112 to a corresponding analog value that is coupled via a suitable bias means 124 to the inverting input of the operational amplifier 96 that is the subtracting means. In order that the counters $N_1$–$N_{16}$ will count up or down as required, one input of a comparator 126 is connected to the input of the full wave rectifier 104, the other input is connected to ground, and the output is connected to appropriate terminals on the counters $N_1$-$N_{16}$.

As in the analog circuit of FIG. 2, restoration of the signal frequencies of zero and just above it is achieved by coupling the signal from the first input 84, 86 to the output O with a low pass filter comprised of a resistor 128 and the capacitor 98.

The output O could be the final output of the circuit but if the commutation noise represented by the wave 80 of FIG. 1 is to be eliminated, the signal at the output O must be passed through a low pass filter indicated as being the same as that of FIG. 2 and having components corresponding to FIG. 2 designated by the same numerals primed. If the second derivative of the signal is to be combined with the signal as it appears at the output O so as to increase the attenuation of the harmonics of hum, the circuit is the same as described in connection with FIG. 2 and corresponding components are indicated by the same numerals primed. The only difference is that a buffer amplifier 130 replaces the transistor 70.

The circuit of FIG. 3 operates in a manner analogous to that of the circuit of FIG. 2. The subtracting means 96 subtracts from the signal a voltage corresponding to the count on the counters $N_1$-$N_{16}$ that is in the circuit at the time in the same way that the capacitors $C_1$-$C_{16}$ of FIG. 2 subtracted voltage from the signal. The portion of the difference between the signal and the amount stored depends on the sensitivity of the voltage-to-frequency converter 108, whereas in FIG. 2 it depended on the time constant RC for each capacitor. Whereas the capacitors $C_1$-$C_{16}$ of FIG. 2 could be charged or discharged through the same RC circuit, the counters $N_1$-$N_{16}$ which are the storage means of FIG. 3 have to be given a signal as to whether to increase or decrease their count, and this is done by the comparator 126.

Whereas the time constant of the capacitor charging circuit of FIG. 2 or the sensitivity of the voltage to frequency converter 108 of FIG. 3 can be selected so as to prevent ringing of objectionable amplitude from appearing in an output signal derived from most ECG signals, the presense of a pulse of high amplitude such as may occur in a signal obtained from a Bundle of HIS may introduce enough energy to cause objectionable ringing. The diode bridge 81 of FIG. 2 or the amplitude limiter 106 of FIG. 3 prevents this from occuring by limiting the rate at which the stored values, i.e., the charge on the capacitors $C_1$-$C_{16}$ of FIG. 2 and the counts on the counters $N_1$-$N_{16}$ of FIG. 3, can be changed when an alternating component of the signal applied to the first inputs 4,6 and 84,86 respectively exceeds a predetermined amplitude. The effective Q of the notches is thus varied as a function of signal amplitude.

What is claimed is:

1. Apparatus for reducing the fundamental frequency and harmonic frequencies of hum in a desired signal, comprising
    a first input to which a desired signal which may include hum may be applied,
    a second input to which a signal having the same frequency as the fundamental frequency of the hum may be applied,
    an output,
    a plurality of signal storage means,
    circuit means coupled to said first input and said output into which a signal storage means may be inserted for subtracting a value of the signal stored by the storage means from the signals passing from said first input to said output and for changing the value stored in the storage means by a fraction of the difference between a signal at said first input and the signal stored in said signal storage means,
    commutating means for connecting said storage means, one after the other, into said circuit means in a repeated sequence having the frequency of the fundamental of said hum so that the value stored in each storage means eventually becomes approximately equal to the value of any hum in the desired signal occurring at the time the storage means is connected to said circuit means,
    means coupled to said first input for deriving the second harmonic of signals appearing thereat, and
    means for adding said second derivative to the signals appearing at said output whereby the attenuation of any harmonics of the hum is more nearly the same, and
    a system output connected to said latter means.

2. Apparatus as set forth in claim 1 wherein said storage means are capacitors.

3. Apparatus as set forth in claim 1 wherein said storage means are counters.

4. Apparatus as set forth in any of claims 1, 2 or 3 wherein a low pass filter is connected between said first input and said system output.

5. Apparatus as set forth in any of claims 1, 2, or 3 wherein a low pass filter is coupled at a point prior to said system output.

6. Apparatus as set forth in claim 1 having a system output, a first low pass filter coupled between said first input and said system output, a second low pass filter having a cut-off frequency below the frequency at which said storage capacitors are inserted between said first input and said output, and means coupling said second low pass filter between said output and said system output.

7. Apparatus for reducing the amplitude of the fundamental frequency and harmonic frequencies of hum in a desired signal, comprising
    a first input to which signals that may contain hum may be applied,
    a second input to which a fundamental frequency of the hum may be applied,
    an output,
    a subtracting means having non-inverting and inverting inputs and an output,
    means coupling said first input to said non-inverting input of said subtracting means,
    means coupling the output of said subtracting means to said output,
    an input terminal and an output terminal,
    a plurality of up-down counters,
    means for inserting said counters between said input and output terminals at a sequential rate that is synchronous with the fundamental frequency of hum present at said second input,
    means coupled to the output of said subtracting means for changing the count in said counters in response to a signal at the output of said subtracting means,
    a digital-to-analog converter coupled to said output terminal,
    a biasing means coupled between the output of said digital-to-analog converter and the inverting input of said subtracting means, the means for changing the count on said counters and said biasing means being such that the counts on said counters are changed by an amount corresponding to a portion of the amplitude of a signal appearing at said output.

8. Apparatus for reducing the amplitude of the fundamental frequency and harmonic frequencies of hum in a desired signal, comprising
a first input to which a desired signal which may include hum may be applied,
a second input to which a signal having the same frequency as the fundamental frequency of the hum may be applied,
an output,
a plurality of signal storage means,
commutating means for connecting said signal storage means between said first input and said output in repeated sequences having the frequency of the fundamental frequency of said hum so as to subtract the signal stored in said storage means from signals passing from said first input to said output,
means coupled to said first input for deriving the second derivative of the signals appearing thereat, and
means for adding the said second derivative and the signal appearing at said output.

9. Apparatus for reducing the amplitude of the fundamental frequency and harmonic frequencies of hum in a desired signal, comprising
a first input to which a desired signal which may include hum may be applied,
a second input to which a signal having the same frequency as the fundamental frequency of the hum may be applied,
an output,
a plurality of storage capacitors,
commutating means for connecting said storage capacitors between said first input and said output in repeated sequences having the frequency of the fundamental frequency of said hum,
a series capacitor and means providing a resistive impedance connected in series in the order named between said output and ground, said series capacitor having less capacitance than the sum of the capacitances of said storage capacitors,
a system output, and
means coupling said system output to said output, whereby the ripple caused by differences in the capacitances of said storage capacitors is reduced.

10. Apparatus as set forth in claim 9 wherein amplifying means are coupled to the junction of said series capacitor and said means providing a resistive impedance for providing a given amount of negative gain for the signals at said junction and wherein amplifying means are coupled to said output for providing for signals thereat a gain that exceeds a whole number by said given amount, and means for combining the outputs of said amplifying means.

11. Apparatus as set forth in either of claims 9 or 10 wherein means are coupled to said first input for deriving the second derivative of signals appearing thereat, and means for adding said second derivative to the signals applied to said system output.

12. Apparatus as set forth in any of claims 9 or 10 wherein a low pass filter is coupled between said first input and said system output.

13. Apparatus as set forth in claim 12 having a low pass filter having a cut-off frequency below the frequency of said commutating means.

* * * * *

UNITED STATES PATENT AND TRADEMARK OFFICE
CERTIFICATE OF CORRECTION

PATENT NO. : 4,336,513
DATED : June 22, 1982
INVENTOR(S) : Richard J. Regan

It is certified that error appears in the above-identified patent and that said Letters Patent is hereby corrected as shown below:

Column 10   line 14   "harmonic" should be changed to

-- derivative --

Signed and Sealed this

Fifth Day of November 1985

[SEAL]

Attest:

Attesting Officer

DONALD J. QUIGG

Commissioner of Patents and Trademarks